(12) United States Patent
Ho et al.

(10) Patent No.: US 7,675,312 B2
(45) Date of Patent: *Mar. 9, 2010

(54) SUB-SAMPLING OF WEAKLY-DRIVEN NODES

(75) Inventors: Ronald Ho, Mountain View, CA (US); Thomas G. O'Neill, Mountain View, CA (US); Robert D. Hopkins, Hayward, CA (US); Frankie Y. Liu, Palo Alto, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 186 days.

This patent is subject to a terminal disclaimer.

(21) Appl. No.: 11/859,463

(22) Filed: Sep. 21, 2007

(65) Prior Publication Data

US 2008/0231308 A1    Sep. 25, 2008

Related U.S. Application Data

(63) Continuation of application No. 11/477,050, filed on Jun. 28, 2006, now Pat. No. 7,279,922.

(51) Int. Cl.
    *G01R 31/26* (2006.01)
(52) U.S. Cl. ..................................... 324/765
(58) Field of Classification Search .............. 324/158.1, 324/754–758, 765; 326/21, 93, 113; 365/233, 365/226, 94
    See application file for complete search history.

(56) References Cited

U.S. PATENT DOCUMENTS

| 6,603,328 | B2 | 8/2003 | Takahashi et al. |
| 6,753,726 | B1 | 6/2004 | Drost et al. |
| 6,825,708 | B1 | 11/2004 | Drost et al. |
| 6,885,213 | B2 | 4/2005 | Sunter |
| 7,026,867 | B2 | 4/2006 | Drost et al. |

(Continued)

OTHER PUBLICATIONS

P. Larsson, et al., "Measuring high-bandwidth signals in CMOS circuits," Electronic Letters, vol. 29, No. 20, Sep. 1993, pp. 1761-1762.

(Continued)

*Primary Examiner*—Ha Tran T Nguyen
*Assistant Examiner*—Trung Q Nguyen
(74) *Attorney, Agent, or Firm*—Robert C Kowert; Meyertons, Hood, Kivlin, Kowert & Goetzel, P.C.

(57) ABSTRACT

A method and apparatus for performing on-chip voltage sampling of a weakly-driven node of a semiconductor device are disclosed. In some embodiments, the node is a floating node or is capacitively-driven. In some embodiments, it is involved in proximity-based communication. Sampling the node may include isolating the signal to be sampled using a source-follower amplifier before passing it to the sampling circuit. Sampling the node may include biasing the node to a desired voltage using a leaky transistor or other biasing circuit. In some embodiments, the biasing circuit may also be used to calibrate the sampler by coupling one or more calibration voltages to the node in place of a biasing voltage and measuring the sampler output. The sampler may be suitable for sub-sampling high frequency signals to produce a time-expanded, lower frequency version of the signals. The output of the sampler may be a current communicated off-chip for testing.

20 Claims, 10 Drawing Sheets

U.S. PATENT DOCUMENTS

| | | | |
|---|---|---|---|
| 7,123,038 B1 | 10/2006 | Ho et al. | |
| 7,279,922 B1 * | 10/2007 | Ho et al. | 324/765 |
| 2006/0075364 A1 | 4/2006 | Drost et al. | |
| 2007/0153920 A1 | 7/2007 | Proebsting et al. | |

OTHER PUBLICATIONS

Ron Ho, et al., "Applications of on-chip samplers for test and measurement of integrated circuits," IEEE Symposium on VLSI Circuits, Jun. 1998, pp. 138-139.

U.S. Appl. No. 11/651,221, filed Jan. 5, 2007.

* cited by examiner

US 7,675,312 B2

SUB-SAMPLING OF WEAKLY-DRIVEN NODES

This application is a Continuation of U.S. patent application Ser. No. 11/477,050 titled "Sub-Sampling of Weakly-Driven Nodes," filed Jun. 28, 2006, now U.S. Pat. No. 7,279,922 whose inventors are Ronald Ho, Thomas G. O'Neill, Robert D. Hopkins, and Frankie Y. Liu.

The U.S. Government has a paid-up license in this invention and the right in limited circumstances to require the patent owner to license others on reasonable terms as provided for by the terms of Contract No. NBCH3039002 awarded by the Defense Advanced Research Projects Agency (DARPA).

BACKGROUND

1. Field of the Invention

This invention relates to the design of on-chip circuitry for testing semiconductor devices. More specifically, it relates to a method and apparatus for performing voltage sub-sampling of weakly-driven nodes of a semiconductor device.

2. Description of the Relevant Art

To understand the functionality of an integrated circuit, it is often useful to monitor the voltage of various signals at specific locations (sometimes referred to as nodes) in the circuit. On-chip sampling circuits have been used to perform non-invasive probing of voltages on a semiconductor chip. Monitoring the voltage of these signals is often accomplished by sampling the signals and then driving the output of the sampler off-chip for observation, such as on one or more pins.

Traditional sampler designs are appropriate for sampling nodes that are directly driven by transistors, but may not be suitable for sampling nodes that are weakly-driven or for sampling floating (rather than actively-driven) nodes. Examples of such nodes include capacitively-driven nodes such as receiver nodes used in proximity communication or low-swing signaling, nodes with weak drivers, or nodes that are far away from their drivers. In these applications, traditional sampler designs may exhibit switching effects that are inconveniently large compared to the amplitude of the sampled signals or they may exhibit unacceptably high leakage currents, clock feed-through, or charge injection effects.

SUMMARY

A method and apparatus for performing voltage sampling of a weakly-driven node of a semiconductor device are disclosed. In some embodiments, the weakly-driven node may be a floating node, that is, one that is not actively driven, such as by a transistor. In other embodiments, the weakly-driven node may be capacitively-driven. In one example, the weakly-driven node may be one involved in proximity-based communication. Proximity-based communication involves transmitting data between two overlapping semiconductor devices by capacitive, inductive, or optical coupling between the devices, in some embodiments. Such proximity-based communication may allow transmission of signals between devices at very high bandwidths without wires or other physical connections. Other examples of weakly-driven nodes include nodes that are located far from their drivers and nodes that are temporarily driven and then left to float, such as domino circuit nodes, for example. The sampler described herein may be suitable for sampling any weakly-driven or low-swing nodes, in various embodiments.

Sampling a weakly-driven node may in some embodiments include isolating the signal to be sampled from diffusion regions in order to reduce degradation of the signal due to leakage. In some embodiments, this isolation may be implemented by passing the signal though a source-follower amplifier before presenting it to the input of the sample and hold circuit of the sampler. Coupling the input signal to the gate of a source-follower amplifier, and not to any diffusions, may in some embodiments reduce or eliminate leakage current issues in the sampler.

The sample and hold circuit of the sampler may in some embodiments include a master pass gate and a slave pass gate, clocked on opposite phases of a sampling clock. These pass gates may include complementary transistors, in some embodiments. An amplifier may convert the measured voltage to a current, which may in some embodiments be multiplied using a current mirror. The output of the sampler may be a current communicated off-chip, such as for testing purposes.

Sampling a weakly-driven node may in some embodiments include biasing the node to a desired voltage using a leaky transistor or other biasing circuit in order to calibrate the sampling circuit. The biasing circuit used may depend on the desired bias voltage. For example, a PMOS transistor may be used to bias a capacitively-driven node to a high voltage, while an NMOS transistor may be used to bias a capacitively-driven node to ground.

In some embodiments, the sampler may be calibrated using an existing biasing circuit, rather than with a separate calibration path and/or dedicated calibration circuitry. In such embodiments, calibration may be performed by coupling one or more known calibration voltages to the capacitively-driven node in place of the biasing voltage. By knowing the calibration voltage(s) applied and measuring the sampler output(s), the input-voltage-to-output-current function of the sampler may be determined and used to calibrate subsequent voltage measurements.

The sampler described herein may be suitable for sub-sampling high frequency signals to produce a time-expanded, lower frequency version of these signals, in some embodiments.

Figure 1:
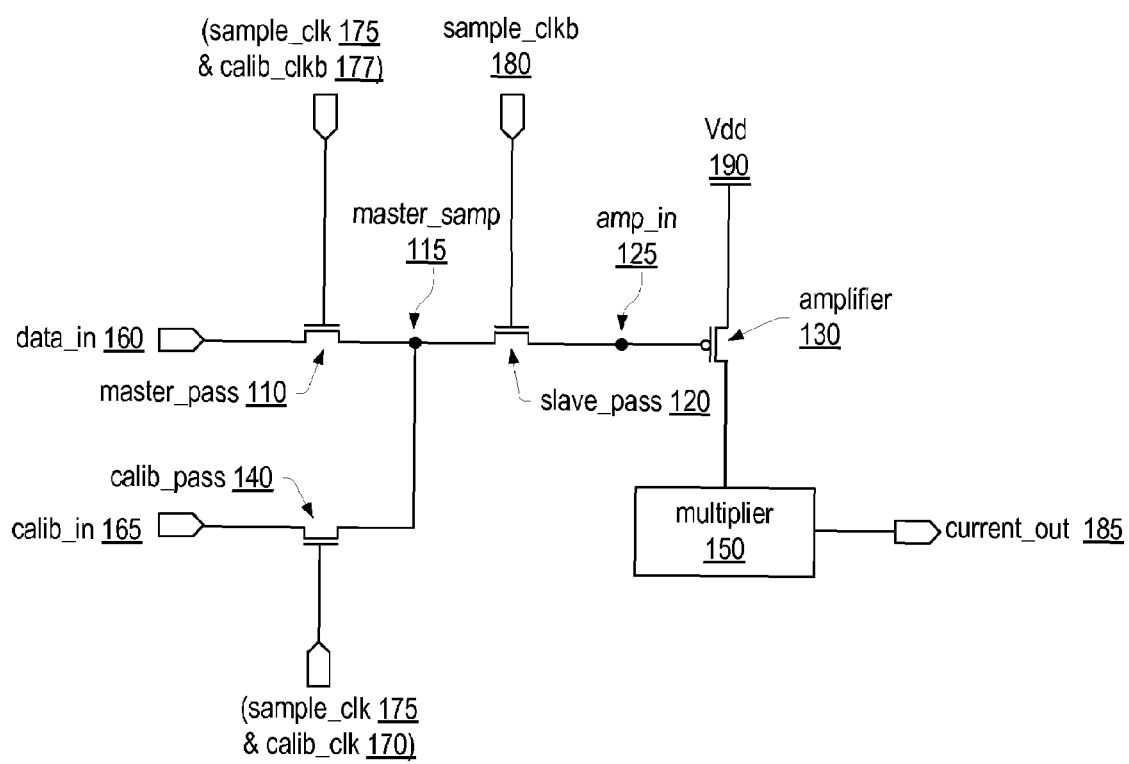
FIG. 1 illustrates a sampling circuit, according to one embodiment.

While the invention is described herein by way of example for several embodiments and illustrative drawings, those skilled in the art will recognize that the invention is not limited to the embodiments or drawings described. It should be understood, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including, but not limited to.

DETAILED DESCRIPTION OF EMBODIMENTS

With advances in VLSI scaling, many on-chip signals of a semiconductor device may be too fast to be driven off-chip, such as for testing, without significant distortion. If a signal is periodic, sampler circuitry may sometimes be used to produce a lower-frequency, sub-sampled version of the signal that may be driven off-chip. For example, during testing of a semiconductor device, a particular input vector may be expected to produce a repeating pattern at a particular node. Using sub-sampling techniques, the actual waveform at the node may be reconstructed off-chip, as described below, and compared to the expected pattern. Sub-sampling may in some embodiments allow such testing to be performed using simpler and/or less expensive techniques than a method for directly observing a high-frequency signal at an on-chip node. For example, a circuit performing sub-sampling need not capture multiple samples for each cycle of the signal being sampled, so in some embodiments it may operate at or below the frequency of the signal being sampled.

In addition, test circuitry following the sampler, whether on-chip or off-chip, may in some embodiments perform functions such as displaying a waveform representing the original signal, storing data representing the signal, or performing analysis of the signal. In some embodiments, this circuitry may not need to be capable of displaying, storing, or analyzing a high-frequency signal, but only a lower-frequency sub-sampled version of the signal. The sub-sampled version may in some embodiments exhibit the same characteristics as the original signal, but on an expanded time scale.

If a node to be sampled is weakly-driven, a traditional sampling circuit may not be suitable for producing a sub-sampled version of the signal at the node. A new sampler circuit, as described herein, may be suitable for sampling floating nodes, weakly-driven signals, or low-swing signals, in some embodiments. This circuit may in some embodiments exhibit very little leakage, compared to traditional sampler designs, and may significantly reduce the relative size of switching effects, as compared to traditional designs.

The techniques described herein may be used to sample nodes involved in proximity-based communication, in some embodiments. In proximity-based communication, two integrated circuit devices may communicate with each other without a physical connection between them. The nodes involved in such proximity-based communication may, in some embodiments, be capacitively-driven, rather than actively driven. For example, two chips that are physically overlapping, but not touching, may communicate by transmitting information using capacitors formed by top-level pads on the two chips. Applying a voltage on one plate may, in some embodiments, result in a plate on the adjacent chip changing voltage through capacitive coupling. This method may in some embodiments provide communication between devices at very high speeds without the need for the wires, pins, solder balls, ESD devices, etc., normally associated with off-chip communication. In some embodiments, as technology advances, the size of the top-level pads scales with it, so the number of such pads that may be formed on the top of devices may increase rapidly.

Semiconductor devices of various types and for various applications may employ proximity-based communication. For example, proximity-based communication may be used to communicate between a CPU and an off-chip cache. Other applications suitable for employing proximity-based communication may include network switches, computer switches, or any other applications in which data may be transmitted between overlapping chips at very high bandwidths.

The techniques described herein may also be applied to other types of weakly-driven signals, such as on-chip floating nodes (nodes not driven by a voltage source), other capacitively-driven nodes, and/or nodes that are far away from their drivers. For example, a capacitor may be used to drive a long wire between a transmitter and receiver, and the signal may degrade significantly by the time it reaches the receiver. In such cases, the amplitude of the signal may not vary over the full voltage range. Signals whose amplitudes do not vary over the full voltage range (for whatever reason) are sometimes referred to as "low-swing" signals. In some embodiments, low-swing signals may be driven by a different power source (i.e., with a lower power supply voltage) than other signals on a chip. In other embodiments, low-swing signals result when a node is weakly-driven or when it is driven temporarily and then allowed to float, e.g., to save power. The techniques described herein may, in some embodiments, be used to sample a low-swing signal without further degrading it.

In the example circuits described herein, the term "high" refers to a voltage at (or near) the power supply voltage and the term "low" refers to a voltage at (or near) ground.

A simple on-chip sampler design is illustrated in FIG. 1. In this example, pass transistors master_pass 110 and slave_pass 120 function as an analog "flip-flop," and inputs sample_clk 175 and sample_clkb 180 are sampling clock signals of equal frequency and opposite phase. When sample_clk 175 is high (and calib_clkb 177 is high), master_pass 110 is transparent and the signal data_in 160 is passed through to node master_samp 115. When sample_clk 175 transitions low, sample_clkb 180 transitions high, making master_pass 110 opaque and slave pass 120 transparent. At this point, the voltage at master_samp 115 is charge-shared with amp_in 125. After a few cycles, amp_in 125 will attain approximately the same voltage that data_in 160 had at the moment when sample_clk 175 transitioned low. Thus, the voltage under test is sampled and a modified version of the voltage is presented to amplifier 130. Amplifier 130 converts this voltage into a current, which may be multiplied by one or more current mirrors in multiplier 150 and sent off-chip to a measuring device, such as an oscilloscope or tester, as current_out 185.

The response of amplifier 130 is non-linear. A calibration experiment may in some embodiments be used to determine the relationship between input voltages (at data_in 160) and corresponding output currents (at current_out 185). In order to calibrate the sampler's input-voltage-to-output-current conversion function, the sampler illustrated in FIG. 1 includes a separate pass gate calib_pass 140. During calibration, calib_clkb 177 may be held low and calibration clock calib_clk 170 may be held high, passing a known calibration voltage, input at calib_in 165, to master_samp 115 in place of data_in 160 while sample_clk 175 is high. When sample_clkb 180 transitions high, the voltage calib_in 165 is presented to amplifier 130 at amp_in 125. This external calibration voltage produces a corresponding calibration output current at current_out 185, which may be used to determine the input-voltage-to-output-current function of the sampler. In some embodiments, this function may then be used to calibrate subsequent voltage measurements.

With sub-sampling, the analog flip-flop formed by pass transistors master_pass 110 and slave_pass 120 may be clocked at a slightly different frequency from the chip's system clock, thereby causing the circuit to sample the voltage of data_in 160 at a slightly different time offset for each cycle of data_in 160. If performed properly, this sub-sampling technique may, in some embodiments, cause the sampling circuit to produce a nearly exact replica of the on-chip voltage waveform of data_in 160, but with an expanded time base.

Figure 2A:
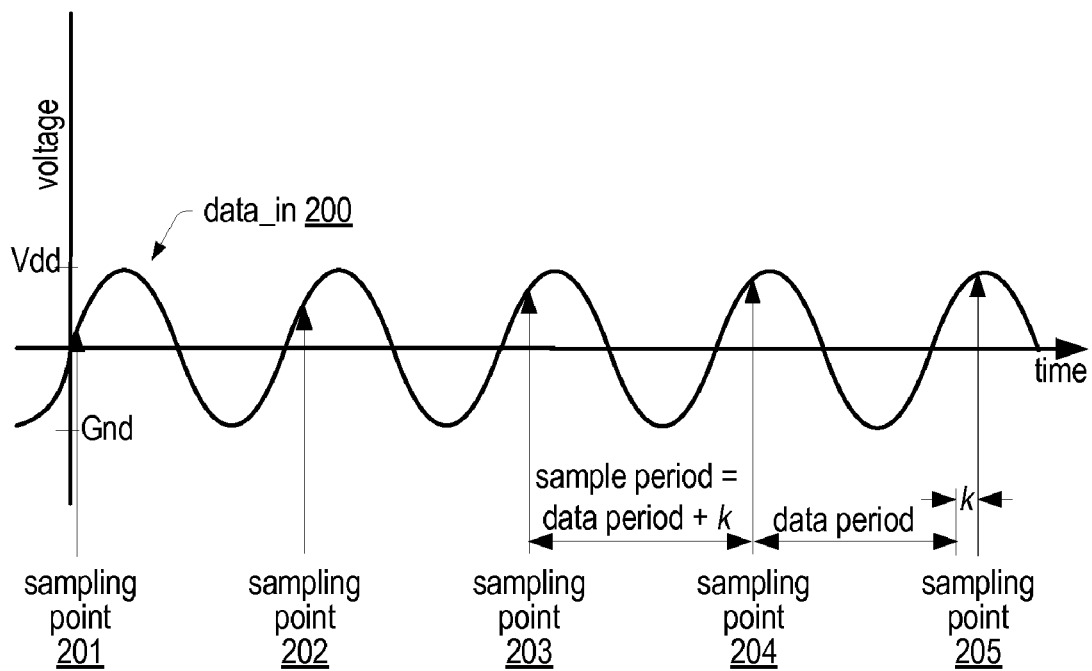
FIGS. 2A and 2B illustrate an exemplary method of sub-sampling a periodic signal.
Figure 2B:
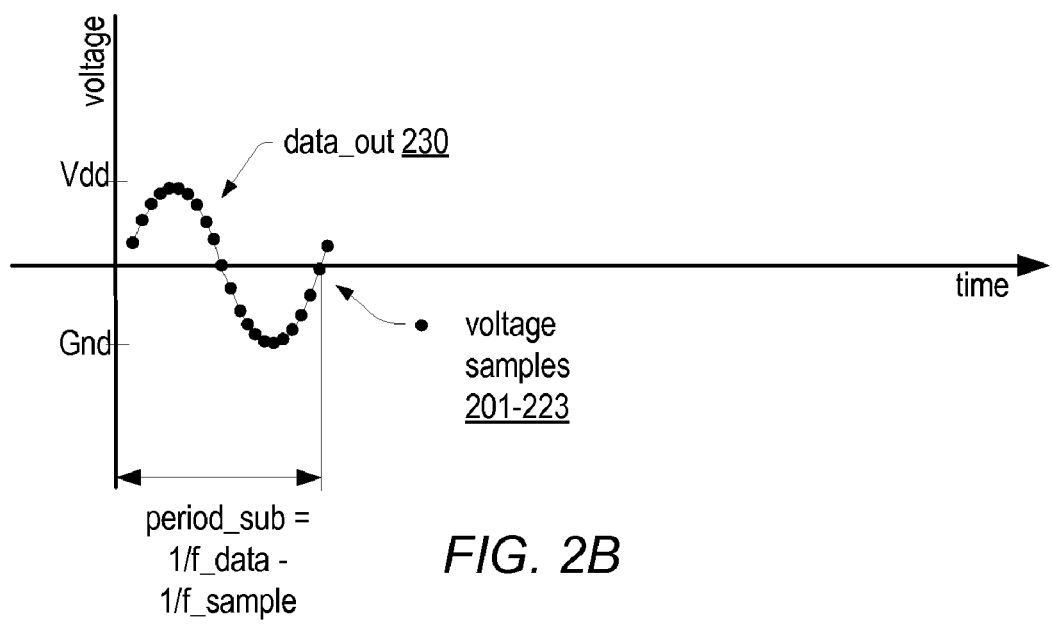

An example of an on-chip signal being sampled using sub-sampling is illustrated in FIGS. 2A and 2B. In this example, the on-chip signal being sampled, data_in 200, exhibits a sinusoidal waveform, ranging from ground (Gnd) to Vdd. If the frequency of the sample clock in this example is f_sample and the frequency of the input signal (i.e., the signal being sampled) is f_data, then the output signal of the sampler will have a sub-sampled frequency f_sub=f_data−f_sample. In this example, a negative f_sub frequency indicates a case in which the sub-sampled waveform appears time-reversed with respect to the input waveform, while a positive f_sub frequency indicates a case in which the sub-sampled waveform is not time-reversed.

As shown in FIG. 2A, data_in 200 is sampled once per cycle at different points in each cycle. In this example, f_sample is lower (slower) than f_data. Thus, each sample is taken at a point a little later in the cycle of the input data than the previous sample. As illustrated, the sample period is greater than the period of data_input 200 by an amount k. Here, the first sample point is shown at 201, the second at 202, and so on.

In this example, the output waveform data_out 230 is illustrated in FIG. 2B. This output waveform has been reconstructed using the voltage samples collected at sample points 201-223. The frequency of the output waveform, f_sub, equals f_data−f_sample. In this example, f_sub is positive and the sub-sampled waveform is not time-reversed. Thus, data_out 230 looks like data_in 200, but on an expanded time base.

Figure 3:
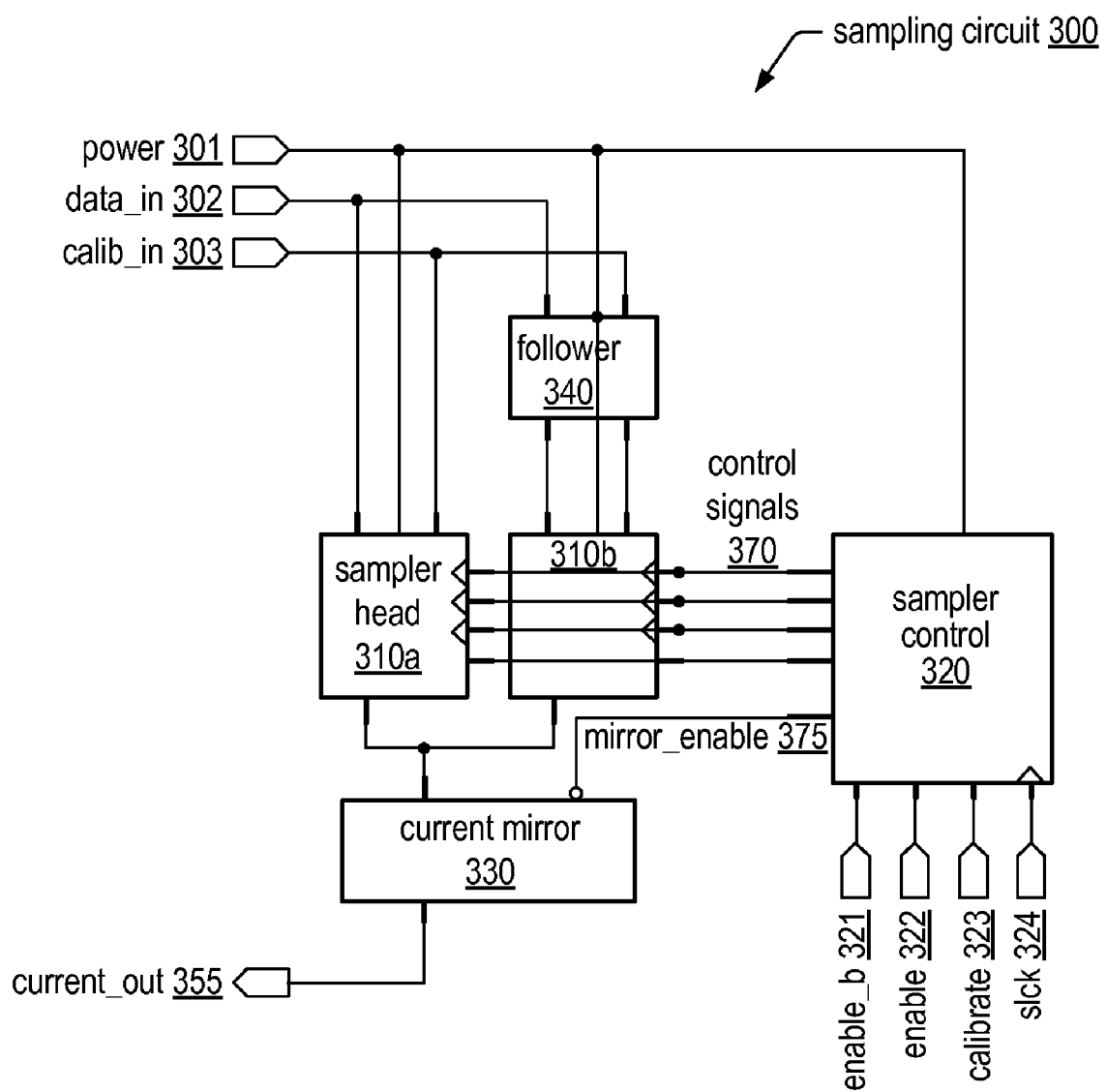
FIG. 3 illustrates an exemplary sub-sampling circuit.
Figure 4:
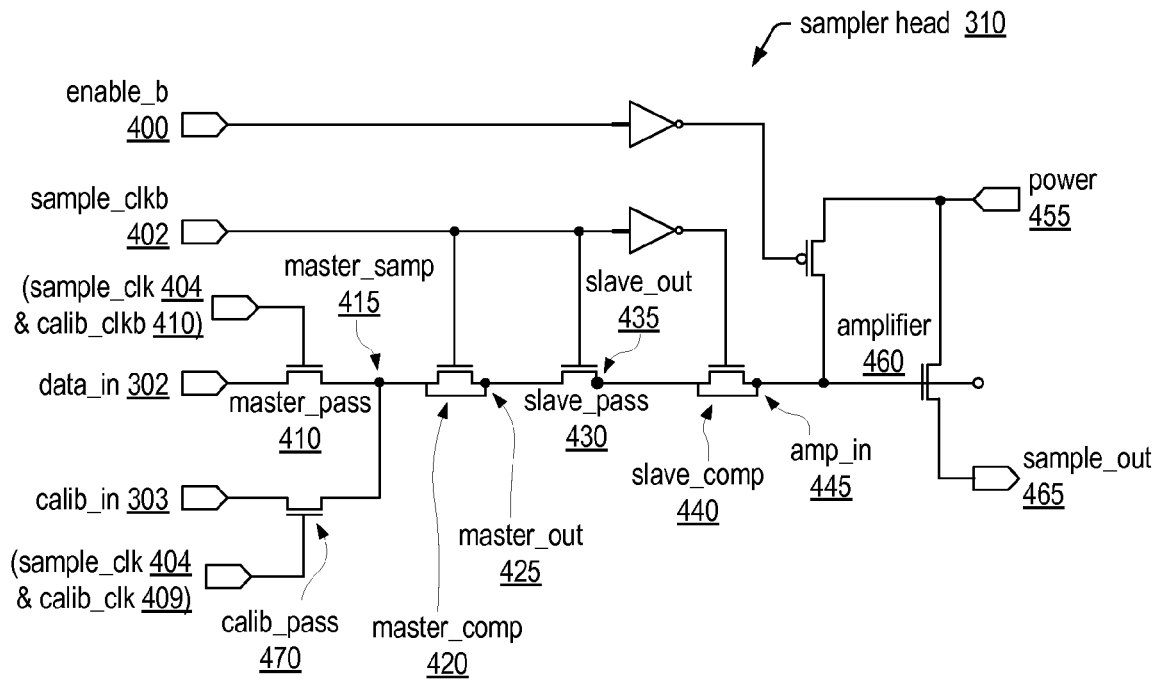
FIG. 4 illustrates a sampler head of an exemplary sub-sampling circuit.
Figure 5:
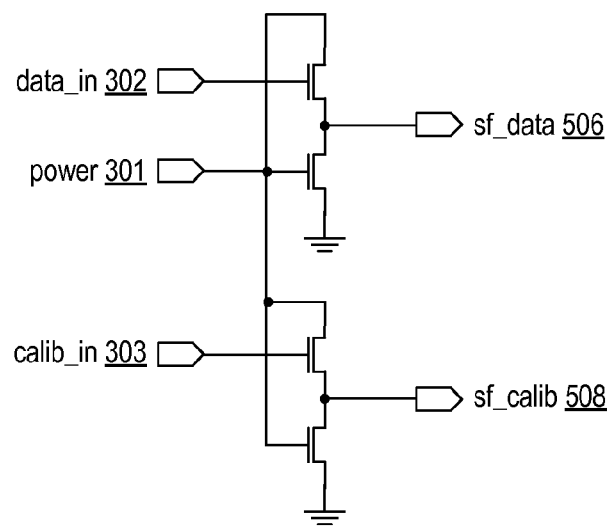
FIG. 5 illustrates a source-follower amplifier of an exemplary sub-sampling circuit.

A second sampling circuit, one that may be suitable for sampling or sub-sampling over an extended voltage range, is illustrated in FIGS. 3-5. In this example, sampling circuit 300, shown in FIG. 3, includes two identical instances of sampler head 310, which will be described in more detail below. Sampling circuit 300 also includes control logic (sampler control 320), current mirror 330, and source-follower amplifier 340. Current mirror 330, in this example, is an NMOS current mirror that amplifies the combined output currents from the two sampler heads 310a and 310b and produces the output, current_out 355.

Sampler head 310 is illustrated in more detail in FIG. 4. In this example, as in the previous sampling circuit, a separate calibration path is included in the sampling circuit. In normal operation, enable_b 400 and calib_clk 409 are low, calib_clkb 410 is high, and sample_clkb 402 has the same frequency as sample_clk 404, but opposite phase. As in the previous example, if the frequency of sample_clk 404 is f_samp and the frequency of the signal data_in 302 is f_data, a sub-sampled output signal will have a frequency of f_sub=f_data−f_samp.

The basic operation of sampler head 310 is similar to that of the sampling circuit illustrated in FIG. 1. First, to sample data_in 302, enable_b 400 is transitioned low. When sample_clk 404 is high, master_pass 410 is transparent and the signal data_in 302 is passed through to node master_samp 415. When sample_clk 404 transitions low, sample_clkb 402 transitions high, making master_pass 410 opaque and slave_pass 430 transparent. As in the previous example, as the voltage under test is sampled, a modified version of the voltage is presented to amplifier 460. Amplifier 460 converts this voltage into a current, shown as sample_out 465. This current may be multiplied by one or more current mirrors (such as current mirror 330 of FIG. 3) and/or communicated off-chip to a measuring device, such as an oscilloscope or tester, as current_out 355 of FIG. 3.

In this example, the output of sampler head 310, sample_out 465, may contain a pair of unwanted contributions from the switching of transistors master_pass 410 and slave_pass 430, known as "clock feed-through" and "charge injection." Clock feed-through, as used herein, may be defined as the result of a coupling of the clock to a diffusion voltage via the gate-diffusion overlap of a transistor. The voltage difference in clock switching may be coupled into a sampled input, and may cause an error in sampling in some embodiments. Charge injection, as used herein, may be defined as a small amount of charge present in a transistor channel that may be injected into the diffusions when the transistor shuts off. In this example, these switching effects of transistor master_pass 410 modify the voltage at node master_samp 415 and the switching effects of transistor slave pass 430 modify the voltage at node slave_out 435. Compensation transistors master_comp 420 and slave_comp 440 may be provided to approximately cancel the switching effects of master_pass 410 and slave_pass 430, respectively, in some embodiments. For example, the clock signal for slave_comp 440 is the inverse of that for slave_pass 430, so that its switching effects have opposite sign. The cancellation may in some embodiments be fine-tuned by simulating the effects of switching and cancellation, such as via a SPICE simulation, using different widths for compensation transistor slave_comp 440. Compensation transistor master_comp 420 may be similarly configured and tuned to cancel switching effects of transistor master_pass 410.

In order to calibrate the input-voltage-to-output-current conversion function of sampler 300, sampler head 310, illustrated in FIG. 4, includes a separate pass gate calib_pass 470. During calibration, calib_clkb 410 may be held low and calibration clock calib_clk 409 may be held high, passing a known calibration voltage, input at calib_in 303, to master_samp 415 in place of data_in 302 while sample_clk 404 is high. As in the previous example, this external calibration voltage produces a corresponding output current at sample_out 465, which may then be used to determine the input-voltage-to-output-current function of sampler 300. This function may then be used to calibrate subsequent voltage measurements, in some embodiments.

The useful voltage range of the sampler 300, illustrated in FIG. 3, may be increased by providing a second sampler head 310 in parallel with the sampler head 310 described above. This second sampler head, shown as sampler head 310b in FIG. 3, may be preceded by source-follower amplifier 340. Source-follower amplifier 340 level-shifts high input signals down to the operational range of the sampler's NMOS pass gates, as described below. In this example, sampler head 310a tracks the voltage at data_in 302 linearly until a cut-off voltage of (Vdd−Vt), while sampler head 310b track tracks data_in 302 linearly after the voltage at data_in 302 exceeds a turn-on voltage of Vt. Thus, combining the outputs of the two sampler heads (310a and 310b) may result in an output signal that tracks data_in 302 over a wider voltage range than previous sampling circuits, in some embodiments.

As described above, source-follower amplifier 340 level-shifts high input signals down to the operational range of the sampler's NMOS pass gates. An exemplary source-follower amplifier 340 is illustrated in FIG. 5. In this example, two source-followers are biased from a DC voltage, shown as power 301. As illustrated in FIGS. 3 and 5, both the data input signal (data_in 302) and the calibration voltage (calib_in 303) are level-shifted using source-followers to produce sf_data 506 and sf_calib 508, respectively. These signals then become inputs to sampler head 310b, while the original signals data_in 302 and calib_in 303 are the inputs to sampler head 310a.

While the exemplary sampling circuit 300 illustrated in FIG. 3 may be appropriate for sampling a wide range of signals on an integrated circuit device, the switching effects of sampling circuit 300 may still be unacceptably large for sampling low-swing or weakly-driven signals, in some embodiments. For example, the switching effects may result in a bigger change in the value of output_current 355 than a corresponding change in the actual value of data_in 302.

In addition, the presence of diffusions coupled to data_in 302 may lead to unwanted leakage currents, in some embodiments. In such embodiments, the output of sampling circuit 300 may have a long-term time-dependence due to these leakage currents, with output values changing radically over time. If the node at which input data_in 302 is sampled is a floating node or a weakly-driven node, or if data_in 302 is a low-swing signal, this time dependence may result in an unacceptably large change in the value of current_out 355. For example, if there is not a resistive driver of signal data_in 302, there may be nothing to prevent leakage from completely destroying the voltage over time, as it drifts toward the power supply voltage or ground.

Figure 6:
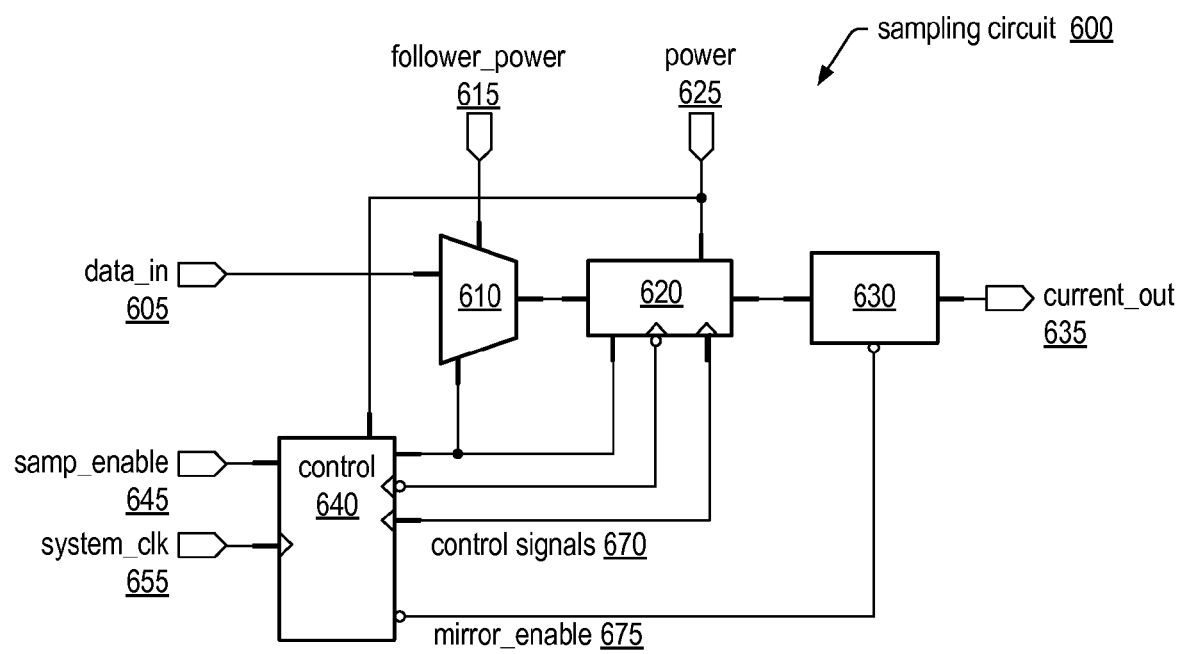
FIG. 6 illustrates a sub-sampling circuit for weakly-driven signals, according to one embodiment.

An alternative sampling circuit 600, illustrated in FIG. 6, may in some embodiments be more suitable for sampling, or sub-sampling, low-swing or weakly-driven signals, such as capacitively-driven signals, floating nodes, nodes located far from their drivers, etc. In this exemplary sampling circuit, input signal data_in 605 is isolated from sampler head 620 by source-follower amplifier 610. Source-follower 610 may in some embodiments be similar to the source-follower illustrated in FIG. 5, but instead of being placed in a path parallel to the data input path, source-follower 610 may be placed directly in the data input path before sampler head 620.

As illustrated in FIG. 6, sampling circuit 600 may also include control logic (sample control 640) and current mirror 630. Control logic 640 may in some embodiments generate various control signals 670, some of which are described later, as well as mirror_enable 675. Current mirror 630 may be an NMOS current mirror amplifying the output of sampler head 620 to produce an off-chip signal, such as current_out 635, for testing, in some embodiments. Sampling circuit 600 may not include a separate calibration path, in some embodiments. In such embodiments, calibration of sampling circuit 600 may be implemented using an existing biasing circuit, as described later, or by other means, or may not be performed at all.

As with the previously described sampling circuits, sampler 600 may be used to sub-sample the voltage data_in 605, in some embodiments. In such embodiments, if the frequency of the sample clock is f_samp and the frequency of the signal data_in 605 is f_data, a sub-sampled output signal will have a frequency of f_sub=f_data−f_samp.

Figure 7:
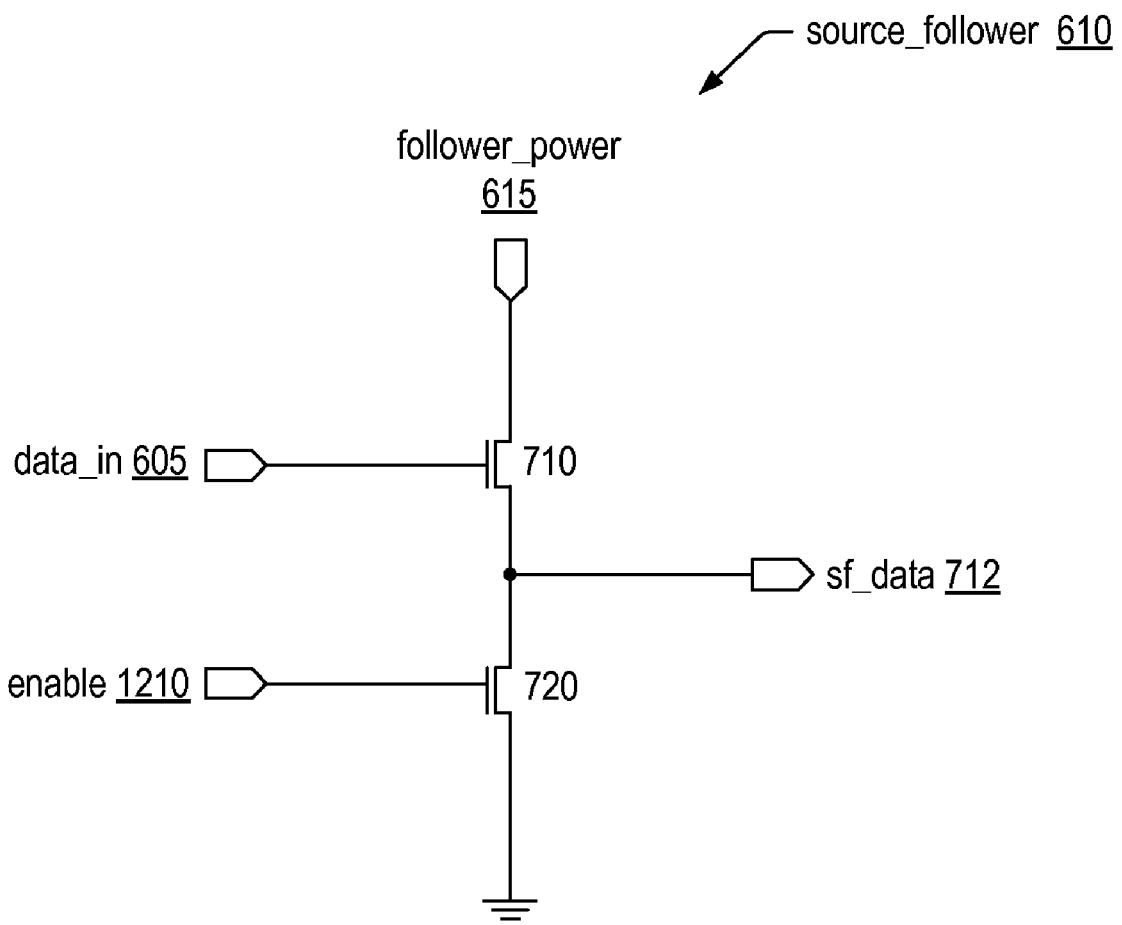
FIG. 7 illustrates a source-follower amplifier suitable for use in a sub-sampling circuit for weakly-driven signals, according to one embodiment.

As illustrated in FIG. 7, data_in 605 connects only to the gate of source-follower amplifier 610, and not to any diffusion regions. In various embodiments, isolating the signal to be sampled from diffusions may reduce or eliminate leakage current problems due to a leakage path through the diffusion to ground. In this example, source-follower 610 is enabled by signal enable 1210 only when the sampler is in use. In this exemplary embodiment, the output of source-follower amplifier 610, sf_data 712, which has been isolated from any diffusions, becomes the input to sampler head 620.

In sampler 600, illustrated by FIGS. 6-9, a source-follower amplifier is used to isolate data_in 605 due to the high bandwidth that may be possible if the source-follower transistors are sized appropriately. In some embodiments, it may be desirable to isolate input signal data_in 605 using the fastest possible amplifier, so an amplifier with a small gain, such as a source-follower amplifier, may be most suitable. In other embodiments, isolating data_in 605 from diffusions may be done using other means, such as a different type of amplifier or other suitable circuit. For example, a unity-gain or positive-gain amplifier may be used to isolate input signal data_in 605 in some embodiments, but these amplifiers may have significantly lower bandwidth than the source-follower amplifier illustrated herein, due in part to negative Miller coupling between the amplifier input and output. The source-follower amplifier illustrated in FIG. 7, on the other hand, has gain less than one, and exhibits positive coupling, with the output moving in the same direction as the input, rather than the reverse. Note that isolation of a sampled node from a sampler may in some embodiments also be desirable for sampling directly-driven nodes. For example, in samplers such as the one illustrated in FIG. 1, the clock switching effects from the master pass gate 110 may inject charge back into the sampled node. If the driver of the sampled node is separated from the sampler by a significant length of wire, this charge may interfere with the normal operation of the sampled circuit, in some embodiments.

Figure 8:
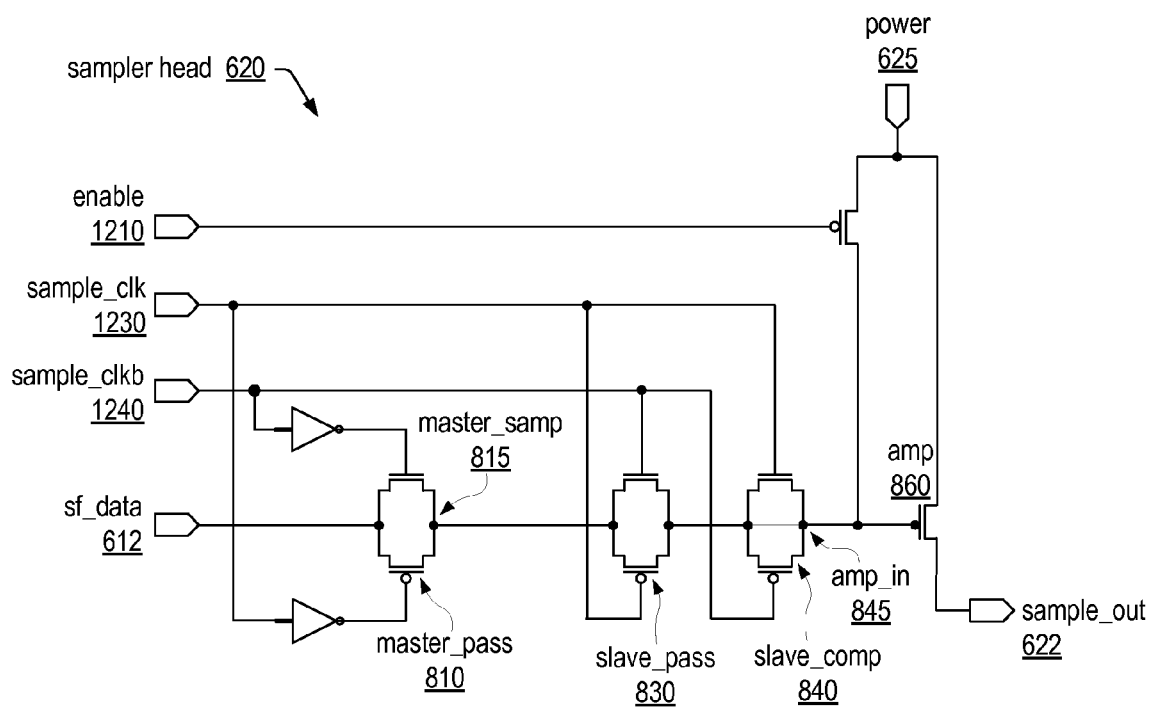
FIG. 8 illustrates a sampler head suitable for sub-sampling weakly-driven signals, according to one embodiment.

Sampler head 620 of FIG. 6 is illustrated in more detail in FIG. 8, according to one embodiment. As in the previous sampling circuit, sampler head 620 includes two pass gates, master_pass 810 and slave_pass 830. These pass gates are clocked on opposite phases of sample_clk 1230 in order to implement a sample and hold circuit, capturing the voltage of signal sf_data 612. Also as in the previous sampling circuit, the sampled voltage is converted into a current by an amplifier, in this case amp 860, whose output is sample_out 622. This output may in some embodiments be multiplied by one or more current mirrors (such as current mirror 630 of FIG. 6) and/or communicated off-chip to a measuring device, such as an oscilloscope or tester, as current_out 635 of FIG. 6. In some embodiments, such as the one illustrated in FIG. 8, each of the pass gates consists of a pair of complementary transistors (i.e., one NMOS pass transistor and one PMOS pass transistor) that are clocked on opposite phases of the sampling clock, sample_clk 1230. For example, the NMOS pass transistor of master_pass 810 is clocked on the opposite phase from the PMOS pass transistor of master_pass 810, according to some embodiments.

As illustrated in FIG. 8, sampler head 620 may also include a compensation device, slave_comp 840, configured to approximately cancel the switching effects of slave_pass 830. For example, the clock signal for slave_comp 840 is the inverse of that for slave_pass 830, so that its switching effects have opposite sign. This cancellation may in some embodiments be fine-tuned by simulating the effects of switching and cancellation, such as via a SPICE simulation, using different widths for the transistors of compensation device slave_comp 840. In the exemplary embodiment illustrated in FIG. 8, there is no master compensation device. In this example, the transistors of slave_pass 830 partially cancel the switching effects from the transistors of master_pass 810 at node master_samp 815. In this example, further switching effects from the master pass gate may be compensated for through calibration, and so a master compensation transistor may not be necessary. In other embodiments, a master compensation transistor, such as one similar to master_comp 440 of FIG. 4, may be included in sampler head 620.

As noted above, sampler head 620 may not include a separate calibration path for calibrating the input-voltage-to-output-current function of sampler 600, in some embodiments. In some embodiments, removing the separate calibration path may reduce leakage because calibration circuitry itself may provide a leakage path. In such embodiments, calibration of the sampler may be implemented using other means or may not be implemented at all, depending on the functionality and sampling accuracy needed in a particular application. One method for calibrating the sampler illustrated in FIGS. 6-8, using an existing biasing circuit, is described below. In other embodiments, calibration may be implemented by including two source-follower amplifiers feeding into sampler head 620. In such embodiments, one source-follower may have data_in 605 as its input, while the second one may have a calibration voltage as its input. In this example, the source-follower amplifiers may be similar to those illustrated in FIG. 5, but the outputs may be tied together or multiplexed, and the combined output may become the input to sampler head 620. In such embodiments, an enable signal may allow the output of the first source-follower (sf_data 712) to be presented to sampler head 620 or the output of the second source-follower (a level-shifted version of the calibration voltage) to be presented to sampler head 620, but not both. In another embodiment, calibrating the sampling circuit illustrated in FIGS. 6-8 may include multiplexing a calibration voltage in place of data_in 605 before source-follower 610, rather than multiplexing the outputs of two instances of source-follower 610.

Floating nodes, low-swing nodes, and capacitively-driven nodes may be pre-charged or biased using a dedicated biasing circuit. In some embodiments, this biasing may be implemented using a "leaky transistor," that is, the leakage current of a transistor may be used to slowly bias a node to a certain voltage. This leakage may, in various embodiments, be the drain-source leakage, the gate leakage, or even the body leakage of the transistor. Various examples of biasing circuits using a leaky transistor are illustrated in FIGS. 9A-9F. Note that the type of transistor used may depend on the desired bias voltage (e.g., NMOS transistors for low voltage, PMOS for high voltage). For example, FIG. 9C illustrates a leaky NMOS transistor used for biasing a signal, such as data_in 605, to a low voltage, while FIG. 9D illustrates a leaky PMOS transistor used for biasing data_in 605 to a high voltage.

Figure 9A:
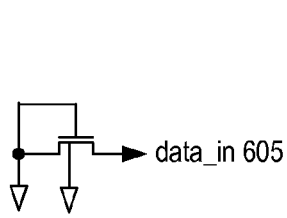
FIG. 9 illustrates various embodiments of a biasing circuit.
Figure 9B:
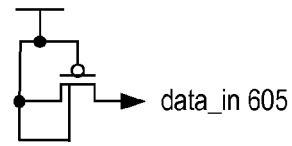
Figure 9C:
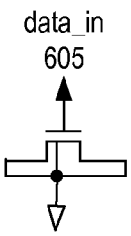
Figure 9D:
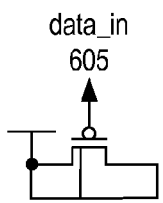

FIGS. 9A and 9B illustrate using the drain-source leakage of a transistor to bias a capacitively-driven node, in this case, data_in 605. In these examples, the source, body and gate of the transistors are all tied to the desired bias voltage (ground in FIG. 9A, power supply voltage in FIG. 9B). Since the gate and source voltage of the transistor are the same, the transistor will not be conducting as long as data_in 605 does not fall below ground or rise above the power supply. However, non-negligible leakage currents from the gate, source, and body may slowly bias the drain to some combination of the gate/source/body voltage. Since these are all tied to the same voltage, the drain may leak to that voltage over time. The time constant of the leakage current may be controlled, in some embodiments, by changing the width or length of the biasing transistor, for example.

Figure 9E:
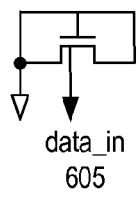
Figure 9F:
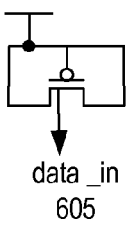

FIGS. 9C and 9D illustrate biasing schemes in which the gate leakage of a transistor may be used for biasing data_in 605 while the source, drain, and body are tied to a bias voltage. FIGS. 9E and 9F illustrate biasing schemes in which the body leakage may be used for biasing data_in 605 while the source, gate, and drain are tied to a bias voltage. These alternate biasing schemes operate in substantially the same manner as those illustrated in FIGS. 9A and 9B, according to various embodiments.

The terminals of the biasing circuits illustrated in FIGS. 9A-9F may be tied to other bias voltages, in some embodiments, not just to ground for the NMOS transistors and the power supply voltage for the PMOS transistors. Additionally, if a floating or capacitively-driven node is biased using a leaky transistor, this transistor may, in some embodiments, also be used to calibrate the sampler. In this case, the terminals may be tied to a calibration voltage, rather than to a bias voltage, and the calibration output may be presented to the sampling circuit just as if it were the biased input voltage. This dual-purpose use of a biasing circuit for both biasing and calibration may, in some embodiments, reduce the complexity of a circuit suitable for sample floating nodes and capacitively-driven nodes. In some embodiments, a sampler employing such a dual-use circuit may use less power than a sampling circuit that includes both a biasing circuit and a separate calibration circuit, since the biasing and calibration are both performed using the leakage current of an "OFF" transistor. Because calibration may be performed only rarely, as compared to the normal operation of the sampler, using a dual-purpose biasing circuit, rather than a separate calibration circuit, may be a cost-effective method of calibrating the samplers described herein, because it may save area, power, and design complexity, in some embodiments.

Figure 10:
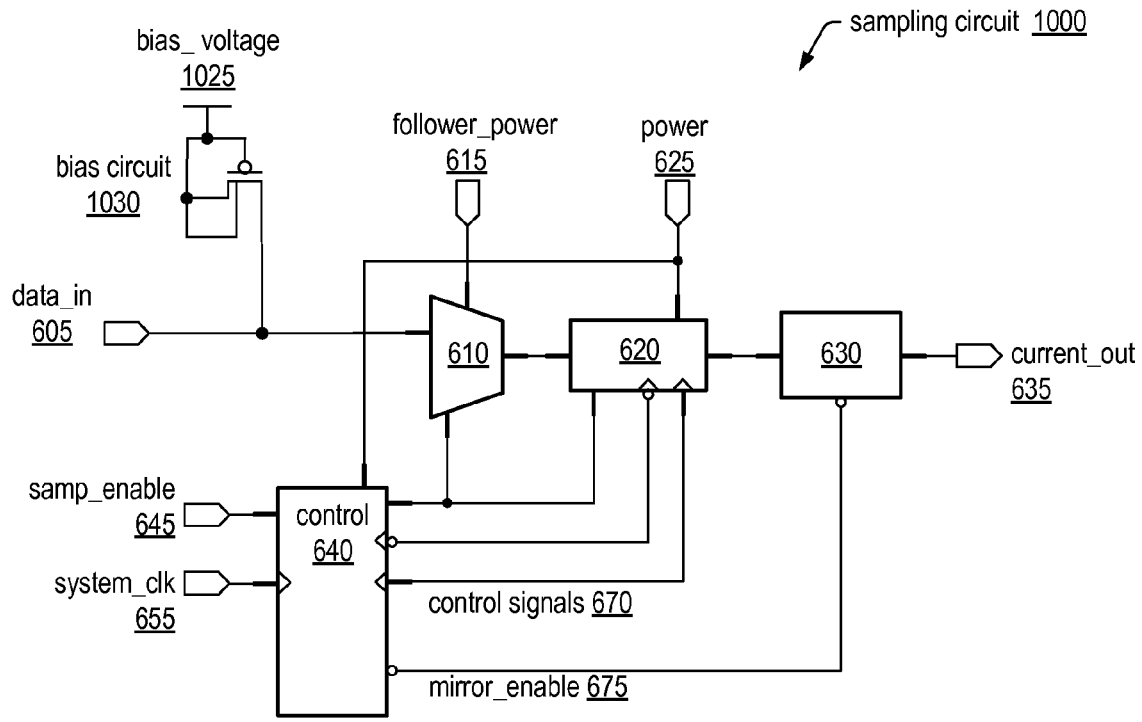
FIG. 10 illustrates the use of a biasing circuit to calibrate a sampling circuit, in one embodiment.

A sampler including a dual-use biasing circuit, as described herein, is illustrated in FIG. 10. In this example, source-follower 610, sampler head 620, mirror 630, and control 640 may be the same, or similar, to those in sampler 600, illustrated in FIG. 6. The dual-use biasing circuit, shown as biasing circuit 1030, consists of a PMOS transistor in which the drain voltage is the output, and the gate, source, and body are all tied to either a bias voltage or a calibration voltage at 1025. During normal operation, the gate, source, and body of the transistor may be tied to a bias voltage (such as the power supply voltage), in some embodiments. During a calibration exercise, the gate, source, and body of the transistor may be tied to one or more calibration voltages, one at a time. Any one of these calibration voltages may be equal to or different from the bias voltage, in various embodiments. Each calibration voltage applied may produce a corresponding calibration output at current_out 635. As with the other sampling circuits, the sampler's input-voltage-to-output-current conversion function may be calculated from this exercise and may be used to calibrate subsequent voltage measurements, in some embodiments. Using the biasing circuit for calibration may in some embodiments reduce the complexity and/or area of the sampling circuit by allowing removal of the separate calibration path of traditional sampler designs.

Alternate pre-charging or biasing schemes (i.e., using biasing circuits including circuit elements other than a leaky transistor) that are employed with floating, low-swing, or capacitively-driven nodes may be similarly used to calibrate a sampler by biasing or pre-charging the nodes to one or more calibration voltages, in other embodiments.

An amplifier-first sampler, such as that described herein, may be useful in any situation in which the input node must be isolated from charge injection from the sampler. For example, such a sampler may be useful for sampling capacitively-driven nodes, nodes with weak drivers, floating nodes, or nodes that are located far from their drivers. Using complementary pass gates in the sampler head, as shown in FIG. 8, may be useful when clock feed-through and charge injection must be minimized, such as when a sampled signal has a small amplitude. Thus, the sampling circuit described herein as being applied to capacitively-driven nodes, floating nodes, and weakly-driven nodes, may be more generally applicable, in some embodiments.

The sampler design illustrated in FIGS. 6-8 may in some embodiments yield significantly better results than a traditional sampler design when sampling capacitively-driven, floating, or otherwise weakly-driven nodes. For example, the source-follower amplifier may virtually eliminate leakage to the sampler, in some embodiments. Due to its sub-unity gain, use of the source-follower amplifier may slightly increase the sampler's sensitivity to switching effects. However, this increase may be compensated for by the use of complementary pass gates in the sampler head, which may reduce the relative size of the switching effects, in some embodiments. The isolation provided by the amplifier may allow this without increasing the leakage on the sampled node, as would occur in prior-art samplers. The switching effects may in some embodiments be smaller at higher frequencies because of time-averaging in the current amplification. The addition of a dual-purpose biasing/calibration circuit, as illustrated by FIGS. 9A-9F and 10, may in some embodiments allow the sampling of capacitively-driven nodes, floating nodes, and the like, without a separate calibration path and, thus, without adding a significant amount of dedicated calibration circuitry.

Figure 11:
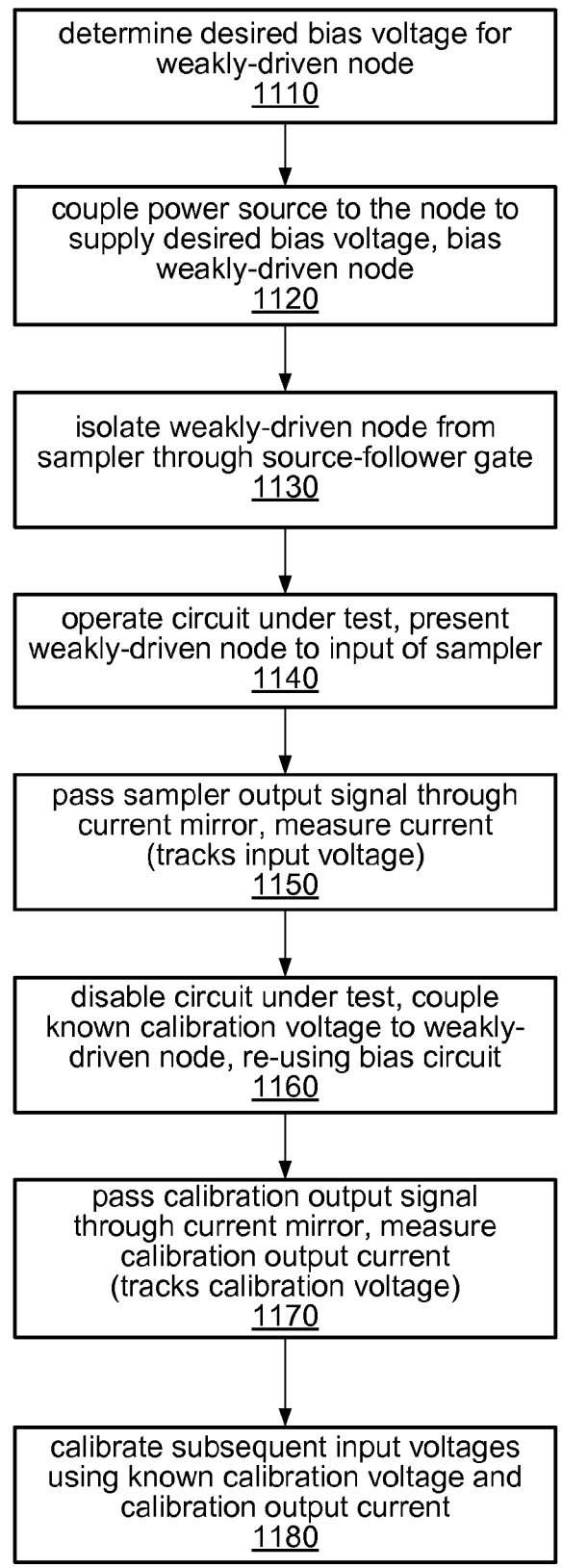
FIG. 11 illustrates a method of sampling weakly-driven nodes, according to one embodiment.

A method for sampling a weakly-driven node of a semiconductor device, as described herein, is illustrated by the flow chart in FIG. 11. In this example, a suitable bias voltage may be determined for the weakly-driven node, as shown in 1110. A power supply may be coupled to the weakly-driven node to supply this bias voltage, as shown in 1120. Biasing the weakly-driven node may in some embodiments involve coupling the node to a biasing circuit similar to one of the biasing circuits illustrated in FIGS. 9A-9F and described above. In other embodiments, biasing the weakly-driven node may involve coupling the node to a dual-purpose biasing circuit, such as the one illustrated in FIG. 10 and described above. In still other embodiments, biasing the weakly-driven node may involve coupling any other type of circuit to the node that may apply a power source to the weakly-driven node to supply a desired bias voltage.

In the example illustrated in FIG. 11, the biased voltage at the weakly-driven node may be passed through a source-follower amplifier, by coupling the biased voltage to the gate of the source-follower amplifier, as shown in 1130. In some embodiments, this may serve to isolate the voltage from diffusion regions of the sampler, as described above. When operating the circuit under test, this isolated voltage may then be presented at the input of the sampler, as shown in 1140. In some embodiments, the sampler may perform voltage sub-sampling, as described herein, for sampling the weakly-driven node.

In this example, an amplifier may be used to convert the output voltage signal of the sampler to an output current. As described above, this output current may in some embodiments be driven off-chip for measurement purposes, as shown in 1150. This output current tracks the input voltage of the sampler, which may be the voltage at the weakly-driven node, the biased voltage at the weakly-driven node, or the isolated voltage, as described above, according to different embodiments.

If the sampling method includes a calibration step, this may be implement as illustrated in 1160-1180 of FIG. 11. In this example, the circuit under test is disabled and a calibration voltage may be selectively coupled to the weakly-driven node, as shown in 1160. This calibration voltage may in some embodiments be coupled to the node using a dual-purpose bias circuit, such as those described herein, or using any other circuit suitable for applying a calibration voltage to the node. In other embodiments, the calibration voltage may be coupled to the input of the sampler through a separate path.

The output current of the sampling circuit may in some embodiments also be passed through a current mirror and multiplied, as shown in 1170. This may be the same current mirror through which the output signal corresponding to the voltage of the weakly-driven node passed, or another current mirror, according to various embodiments. In this example, the multiplied output current may be driven off-chip for measuring purposes and may track the calibration voltage.

If the sampling method includes calibration, as described above, the output current measurement and known calibration voltage may be used to determine an input-voltage-to-output-current function for the sampler, as illustrated in 1180. In some embodiments, this calibration step may involve a single calibration exercise involving a single calibration voltage, while in other embodiments, multiple calibration measurements may be taken for the same or different calibration voltages to determine the function of the sampler.

Additional features may be included in the sampler circuit described herein for sampling floating and weakly-driven nodes, according to various embodiments. For example, in some embodiments, the transistors of master_pass 810 may be folded to minimize the area of the input diffusions. Transistor folding, as used herein, is a method for changing the geometry of a transistor design (e.g., the shape of the gate, source, and/or drain regions) while retaining the transistor's original characteristics. Transistor folding is typically employed in order to minimize total chip area. For example, transistor folding may be used to change the size or aspect ratio of a memory element in order to maximize placement, and minimize area, of an array of such memory elements. Folding the transistors of master_pass 810 such that the drain diffusion is cut in half, for example, may, in some embodiments, reduce the capacitive loading on source-follower amplifier 610, without affecting the capacitance on node master_samp 815. Thus, the charge-sharing efficiency across node master_samp 815 may not be negatively affected, but the amplifier may be able to drive master_samp 815 with increased bandwidth. Folding the transistors of master_pass 810 may, in some embodiments, also reduce the area of the sampling circuit. In another embodiment, area may be reduced by using source-drain sharing, rather than folding.

Figure 12:
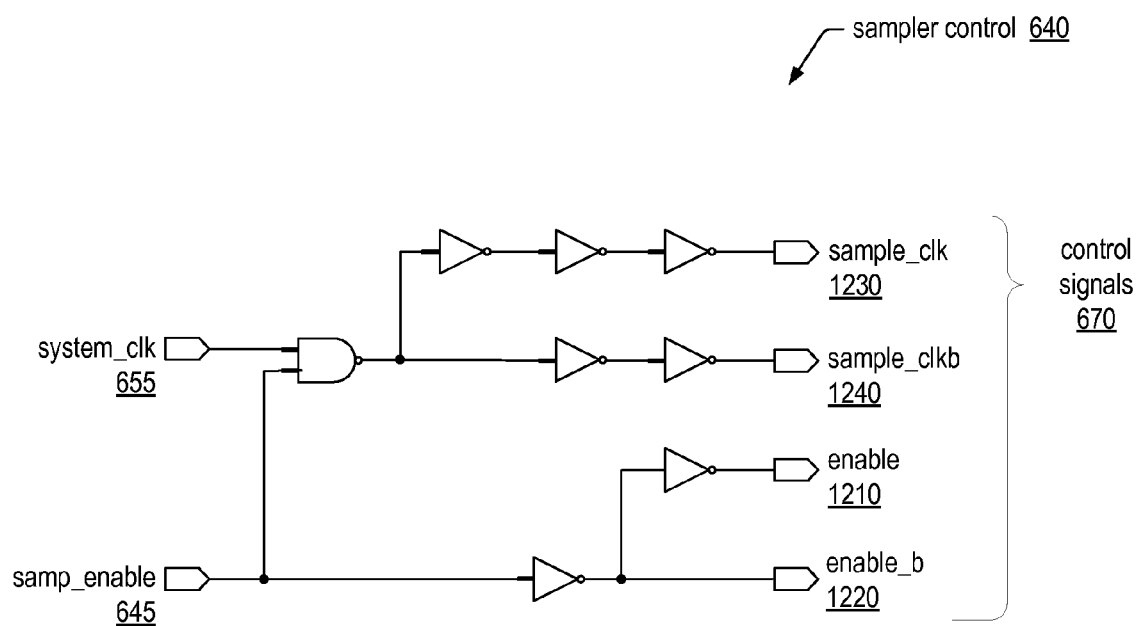
FIG. 12 illustrates a sampler control circuit, according to one embodiment.

The sampler circuit described herein may, in some embodiments, include changes in the way various control signals 670 are generated, as compared to traditional sampler designs. For example, FIG. 12 illustrates two inverters used in the generation of sample_clkb 1240 and three used for the generation of sample_clk 1230. A traditional sampler design may use only one inverter for the generation of sample_clkb 1240 (or sample_clk 1230) and none for the other. In some embodiments, using additional inverters in clock generation may result in matching delays through the inverters on both the rising and falling edges of the clock signal. This may ensure that the clock edges stay aligned regardless of variations in the fabrication process, in some embodiments.

In order to further reduce the size of the switching effects of the transistors of sampler 600, low-swing clock signals may be used to control the pass gates of sampler head 620, in some embodiments. In such embodiments, most of the conductivity change may occur within about 100 mV of the threshold voltage (in the examples described herein), so a swing of a few hundred millivolts may be sufficient for this clock signal, in some embodiments.

In another embodiment, a delay may be intentionally added to the clock signals clocking master_pass 810, such that they are delayed by one gate delay compared to the clocks of slave_pass 830. Without such a delay, there may be a brief period during which both master_pass 810 and slave_pass 830 are partially conducting during the switching transition when the NMOS transistor of master_pass 810 is going transparent and the NMOS transistor of slave_pass 830 is going opaque, in some embodiments. This transition occurs 180 degrees out of phase with sampling the voltage of data_in 605, which occurs when the NMOS transistor of master_pass 810 is going opaque. Delaying the master pass gate clocks may, in some embodiments reduce any contribution to the sampled voltage from the wrong phase without increasing switching effects. Because of the added delay, there may be approximately one gate delay of time during each cycle when the slave pass gate has gone transparent and the master pass gate has not yet gone opaque, in some embodiments. As this occurs in phase with sampling the voltage of data_in 605, this may not negatively affect the functioning of the sampler, in some embodiments.

A separate power supply may in some embodiments be used for clocking compensation device slave_comp 840. This may allow fine-tuning of the cancellation of the switching effects of sampler 600, in such embodiments. Similarly, multiple, differently-sized slave compensation devices may be used in some embodiments. In such embodiments, selecting between these devices may allow fine-tuning of the cancellation of switching effects.

The size of the switching effects of sampler 600 may, in some embodiments, be reduced by increasing the capacitance on node amp 860. In such embodiments, the charge from the switching effects may produce a smaller voltage change. Increasing the capacitance on node amp 860, such as by using multiple slave compensation devices or by other means, may decrease the efficiency of charge-sharing across node master_samp 815, in some embodiments. In such embodiments, the sampler may be run at lower sub-sampled frequencies (f_sub) to compensate for the increased capacitance.

The capacitive load on source-follower 610 may in some embodiments be reduced by making the master_pass 810 NMOS-only (or PMOS only) instead of complementary. This may lead to a larger bandwidth to drive node master_samp 815, in some embodiments. In embodiments using an NMOS-only master pass gate, the switching effects of sampler 600 may be significantly larger, so the complementary slave pass gate slave_pass 830 may no longer yield a significant reduction in the switching effects from master_pass 810. In such embodiments, including a master compensation device, such as master_comp 420, illustrated in FIG. 4, may compensate for these effects. Reduced capacitance on node master_samp 815 may also reduce the efficiency of the charge-sharing, in some embodiments.

If some leakage current is acceptable, source-follower amplifier 610, as described herein, may be placed between the master and slave pass gates, master_pass 810 and slave_pass 830, in some embodiments, rather than before master_pass 810, in some embodiments. This may significantly increase the bandwidth of the sampler by eliminating charge-sharing at the slave_pass transistor, in some embodiments. In such embodiments, significantly lower bandwidths may be acceptable and so higher gain amplifiers may be used. The gain, in these embodiments, may increase the sensitivity of the sample and decrease the relative size of the clock feed-through.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components and operations are somewhat arbitrary, and particular operations are illustrated in the context of specific illustrative configurations. Other allocations of functionality are envisioned and may fall within the scope of claims that follow. Finally, structures and functionality presented as discrete components in the exemplary configurations may be implemented as a combined structure or component. These and other variations, modifications, additions, and improvements may fall within the scope of the invention as defined in the claims that follow.

What is claimed is:

1. An apparatus for performing voltage sampling on a semiconductor device, comprising:

a sampling circuit; and an input circuit configured to:

receive an input voltage signal from a weakly-driven node of the semiconductor device; and electrically isolate the input voltage signal from charge injection or leakage effects of the sampling circuit to produce an isolated input voltage; wherein the isolated input voltage is coupled to the input of the sampling circuit; and wherein the sampling circuit is further configured to:

sample the isolated input voltage at a sampling frequency determined by a sampling clock input signal; and produce a sampler output signal that tracks the input voltage signal.

2. The apparatus of claim 1, wherein the weakly-driven node is one of: a floating node, a low-swing node, and a capacitively-driven node.

3. The apparatus of claim 1, wherein the input circuit comprises a source-follower amplifier, and wherein the input voltage signal is coupled to a gate of the source-follower amplifier.

4. The apparatus of claim 1, further comprising a biasing circuit, wherein the biasing circuit is configured to couple a low-current bias source to the weakly-driven node to supply a desired bias voltage without stopping data transmission through the weakly-driven node.

5. The apparatus of claim 4, wherein the biasing circuit is further configured to selectively couple a known calibration voltage to the weakly-driven node in place of the desired bias voltage, such that the sampling circuit produces a calibration output signal corresponding to the known calibration voltage.

6. The apparatus of claim 1, wherein the sampling frequency is less than a frequency of the input voltage signal, and wherein the sampling circuit is configured to implement sub-sampling of the isolated input voltage.

7. The apparatus of claim 1, wherein the sampling circuit comprises:

a master pass gate and a slave pass gate, wherein the master pass gate and the slave pass gate are configured to be clocked on different phases of the sampling clock input signal to implement a sample and hold function for sampling the isolated input voltage; and one or more compensation transistors each configured to cancel switching effects of a corresponding one of the pass gates of the sampling circuit, wherein each compensation transistor is clocked on a different phase of the sampling clock input signal than the corresponding pass gate.

8. The apparatus of claim 1, further comprising a current mirror coupled to the sampler output signal, wherein the current mirror is configured to multiply the sampler output signal to produce a multiplied output current and to couple the multiplied output current to a measuring device.

9. The apparatus of claim 8, wherein the measuring device is external to the semiconductor device.

10. A method for performing voltage sampling on a semiconductor device, comprising:
    passing an input voltage signal at a weakly-driven node within the semiconductor device through an isolation circuit to isolate the input voltage from charge injection or leakage effects introduced by a sampling circuit at an input of the sampling circuit; and
    supplying the isolated input voltage to the input of the sampling circuit;
    the sampling circuit sampling the isolated input voltage at a frequency determined by a sampling clock input signal; and
    the sampling circuit producing a sampler output signal that tracks the input voltage signal.

11. The method of claim 10, wherein the weakly-driven node is one of: a floating node, a low-swing node, and a capacitively-driven node.

12. The method of claim 10, wherein the isolation circuit comprises a source-follower amplifier, and wherein the input voltage is coupled to a gate of the source-follower amplifier.

13. The method of claim 10, further comprising biasing the weakly-driven node, wherein biasing the node comprises a biasing circuit coupling a low-current source to the node to supply a desired bias voltage, and wherein said biasing is performed without stopping data transmission through the node during biasing.

14. The method of claim 13, further comprising performing a calibration operation, wherein performing a calibration operation comprises:
    the biasing circuit selectively coupling a known calibration voltage to the weakly-driven node in place of the desired bias voltage, wherein the calibration voltage is supplied by an external calibration voltage source;
    subsequent to the biasing circuit biasing the node to the calibration voltage, measuring the sampler output signal; and
    using the known calibration voltage and a result of said measuring the sampler output signal to calibrate subsequent voltage measurements.

15. The method of claim 10, wherein the sampling frequency is less than a frequency of the isolated input voltage, and wherein said sampling comprises the sampling circuit implementing sub-sampling of the isolated input voltage.

16. The method of claim 10, further comprising:
    passing the sampler output signal through an amplifier and a current mirror to produce a multiplied output current;
    coupling the multiplied output current to a measuring device; and
    measuring the multiplied output current during testing of the semiconductor device.

17. An method for performing voltage sampling on a semiconductor device, comprising:
    receiving an input voltage signal from a weakly-driven node of the semiconductor device;
    a biasing circuit coupling a low-current bias source to the weakly-driven node to supply a desired bias voltage without stopping data transmission through the weakly-driven node;
    sampling the input voltage signal at a sampling frequency determined by a sampling clock input signal, wherein the sampling frequency is less than a frequency of the input voltage signal, and wherein said sampling comprises the sampling circuit implementing sub-sampling of the input voltage signal; and
    producing a sampler output signal that tracks the input voltage signal, wherein the sampler output signal comprises an expanded time base relative to the input voltage signal.

18. The method of claim 17, further comprising:
    the biasing circuit selectively coupling a known calibration voltage to the weakly-driven node in place of the desired bias voltage;
    producing a calibration output signal corresponding to the known calibration voltage, wherein the known calibration voltage is supplied by an external calibration voltage source; and
    measuring the calibration output signal to produce a measured calibration output usable in calibrating subsequent voltage measurements.

19. The method of claim 17, further comprising passing the input voltage signal through an isolation circuit to isolate the input voltage from charge injection or leakage effects introduced by a sampling circuit prior to said sampling, wherein said sampling the input voltage signal comprises sampling the isolated input voltage.

20. The method of claim 19, wherein the isolation circuit comprises a source-follower amplifier.

* * * * *